(12) United States Patent
Chin et al.

(10) Patent No.: US 7,535,764 B2
(45) Date of Patent: May 19, 2009

(54) ADJUSTING RESISTANCE OF NON-VOLATILE MEMORY USING DUMMY MEMORY CELLS

(75) Inventors: Henry Chin, Palo Alto, CA (US); Nima Mokhlesi, Los Gatos, CA (US); Dengtao Zhao, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/688,874

(22) Filed: Mar. 21, 2007

(65) Prior Publication Data

US 2008/0273388 A1    Nov. 6, 2008

(51) Int. Cl.
*G11C 11/34* (2006.01)
(52) U.S. Cl. .................. 365/185.2; 365/185.17
(58) Field of Classification Search ............. 365/185.2, 365/185.17
See application file for complete search history.

(56) References Cited

U.S. PATENT DOCUMENTS

| | | | |
|---|---|---|---|
| 5,532,962 A | 7/1996 | Auclair |
| 5,539,690 A | 7/1996 | Talreja |
| 5,590,072 A | 12/1996 | Choi |
| 5,657,332 A | 8/1997 | Auclair |
| 5,696,717 A | 12/1997 | Koh |
| 5,764,572 A | 6/1998 | Hammick |
| 5,862,074 A | 1/1999 | Park |
| 5,867,429 A | 2/1999 | Chen |
| 5,943,260 A | 8/1999 | Hirakawa |
| 6,044,019 A | 3/2000 | Cernea |
| 6,046,935 A | 4/2000 | Takeuchi |
| 6,154,157 A | 11/2000 | Wong |
| 6,160,739 A | 12/2000 | Wong |
| 6,175,522 B1 | 1/2001 | Fang |
| 6,181,599 B1 | 1/2001 | Gongwer |
| 6,222,762 B1 | 4/2001 | Guterman |
| 6,259,632 B1 | 7/2001 | Khouri |
| 6,285,593 B1 | 9/2001 | Wong |
| 6,310,809 B1 | 10/2001 | Roohparvar |
| 6,345,000 B1 | 2/2002 | Wong |
| 6,456,528 B1 | 9/2002 | Chen |
| 6,462,988 B1 | 10/2002 | Harari |

(Continued)

FOREIGN PATENT DOCUMENTS

EP    0801398    10/1997

(Continued)

OTHER PUBLICATIONS

U.S. Appl. No. 60/791,365, filed Apr. 12, 2006, Reducing the Impact of Program Disturb for a Word Line, by Gerrit Jan Hemink.

(Continued)

*Primary Examiner*—Michael T Tran
(74) *Attorney, Agent, or Firm*—Vierra Magen Marcus & DeNiro LLP

(57) ABSTRACT

In some non-volatile storage systems, a block of data memory cells is manufactured with a dummy word line at the bottom of the block, at the top of the block, and/or at other locations. By selectively programming memory cells on the dummy word line(s), the resistances associated with the data memory cells can be changed to account for different programmed data patterns.

23 Claims, 11 Drawing Sheets

U.S. PATENT DOCUMENTS

| | | | |
|---|---|---|---|
| 6,504,762 B1 | 1/2003 | Harari | |
| 6,522,580 B2 | 2/2003 | Chen | |
| 6,528,841 B2 | 3/2003 | Choi | |
| 6,532,556 B1 | 3/2003 | Wong | |
| 6,535,423 B2 | 3/2003 | Trivedi | |
| 6,542,407 B1 | 4/2003 | Chen | |
| 6,570,785 B1 | 5/2003 | Mangan | |
| 6,570,790 B1 | 5/2003 | Harari | |
| 6,584,594 B1 | 6/2003 | Walters, Jr. | |
| 6,643,188 B2 | 11/2003 | Tanaka | |
| 6,657,891 B1 | 12/2003 | Shibata | |
| 6,717,847 B2 | 4/2004 | Chen | |
| 6,717,851 B2 | 4/2004 | Mangan | |
| 6,760,068 B2 | 7/2004 | Petropoulos | |
| 6,771,536 B2 | 8/2004 | Li | |
| 6,781,877 B2 | 8/2004 | Cernea | |
| 6,791,869 B2 | 9/2004 | Ooishi | |
| 6,807,095 B2 | 10/2004 | Chen | |
| 6,859,397 B2 | 2/2005 | Lutze | |
| 6,870,766 B2 | 3/2005 | Cho | |
| 6,870,768 B2 | 3/2005 | Cernea | |
| 6,888,758 B1 | 5/2005 | Hemink | |
| 6,956,770 B2 | 10/2005 | Khalid | |
| 6,987,696 B1 | 1/2006 | Wang | |
| 7,009,901 B2 | 3/2006 | Baker | |
| 7,020,017 B2 | 3/2006 | Chen | |
| 7,057,939 B2 | 6/2006 | Li | |
| 7,061,071 B2 | 6/2006 | Gilton | |
| 7,102,913 B2 | 9/2006 | Nazarian | |
| 7,130,235 B2 | 10/2006 | Perner | |
| 7,239,556 B2 | 7/2007 | Abe | |
| 7,263,000 B2 | 8/2007 | Hazama | |
| 7,286,430 B2 * | 10/2007 | Hanzawa et al. | 365/189.15 |
| 2002/0051383 A1 | 5/2002 | Mangan | |
| 2003/0112663 A1 | 6/2003 | Quader | |
| 2003/0128586 A1 | 7/2003 | Chen | |
| 2003/0133340 A1 * | 7/2003 | Lee | 365/200 |
| 2003/0137888 A1 | 7/2003 | Chen | |
| 2003/0161182 A1 | 8/2003 | Li | |
| 2003/0218920 A1 | 11/2003 | Harari | |
| 2004/0012998 A1 | 1/2004 | Chien | |
| 2004/0027865 A1 | 2/2004 | Mangan | |
| 2004/0042270 A1 | 3/2004 | Huang | |
| 2004/0047182 A1 | 3/2004 | Chernea | |
| 2004/0057283 A1 | 3/2004 | Cernea | |
| 2004/0057285 A1 | 3/2004 | Cernea | |
| 2004/0057287 A1 | 3/2004 | Cernea | |
| 2004/0057318 A1 | 3/2004 | Cernea | |
| 2004/0060031 A1 | 3/2004 | Cernea | |
| 2004/0062074 A1 * | 4/2004 | Ooishi | 365/158 |
| 2004/0079988 A1 | 4/2004 | Harari | |
| 2004/0095825 A1 * | 5/2004 | Tanizaki et al. | 365/207 |
| 2004/0109357 A1 | 6/2004 | Cernea | |
| 2004/0156241 A1 | 8/2004 | Mokhlesi | |
| 2004/0179404 A1 | 9/2004 | Quader | |
| 2004/0190337 A1 | 9/2004 | Chen | |
| 2005/0144516 A1 * | 6/2005 | Gonzalez et al. | 714/8 |
| 2005/0169095 A1 * | 8/2005 | Bedeschi et al. | 365/232 |
| 2006/0221660 A1 | 10/2006 | Hemink | |
| 2006/0239077 A1 | 10/2006 | Park | |
| 2007/0070710 A1 * | 3/2007 | Takenaka | 365/189.01 |

FOREIGN PATENT DOCUMENTS

| | | |
|---|---|---|
| EP | 01271553 | 1/2003 |
| EP | 01329898 | 7/2003 |

OTHER PUBLICATIONS

U.S. Appl. No. 11/413,951, filed Apr. 28, 2006, Reducing the Impact of Program Disturb During Read, by Gerrit Jan Hemink.

U.S. Appl. No. 11/421,66, filed Jun. 1, 2006, Verify Operation for Non-Volatile Storage Using Different Voltages, by Gerrit Jan Hemink.

U.S. Appl. No. 11/617,972, filed Dec. 29, 2006, Resistance Sensing and Compensation for Non-Volatile Storage, by Nima Mokhlesi, et al.

U.S. Appl. No. 11/688,875, filed Mar. 21, 2007.

Notice of Allowance dated Jul. 23, 2008, U.S. Appl. No. 11/688,875, filed Mar. 21, 2007.

International Search Report, dated Nov. 6, 2008, PCT Appl. No. PCT/US2008/057245, filed Mar. 17, 2008.

Written Opinion of the International Searching Authority, dated Nov. 6, 2008, PCT Appl. No. PCT/US2008/057245, filed Mar. 17, 2008.

* cited by examiner

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 1 | 0 | 1 | 0 | 1 | 0 | 1 | 0 | 1 | 0 | 1 | 0 | 1 | 0 |
| 3rd Higher Page | 1 | 1 | 0 | 0 | 1 | 1 | 0 | 0 | 1 | 1 | 0 | 0 | 1 | 1 | 0 | 0 |
| 2nd Upper Page | 1 | 1 | 1 | 1 | 0 | 0 | 0 | 0 | 1 | 1 | 1 | 1 | 0 | 0 | 0 | 0 |
| 1st Lower Page | 1 | 1 | 1 | 1 | 1 | 1 | 1 | 1 | 0 | 0 | 0 | 0 | 0 | 0 | 0 | 0 |

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 0 | 1 | 1 | 0 | 0 | 1 | 1 | 0 | 0 | 1 | 1 | 0 | 0 | 1 |
| 3rd Higher Page | 1 | 1 | 0 | 0 | 0 | 0 | 1 | 1 | 1 | 1 | 0 | 0 | 0 | 0 | 1 | 1 |
| 2nd Upper Page | 1 | 1 | 1 | 1 | 0 | 0 | 0 | 0 | 0 | 0 | 0 | 0 | 1 | 1 | 1 | 1 |
| 1st Lower Page | 1 | 1 | 1 | 1 | 1 | 1 | 1 | 1 | 0 | 0 | 0 | 0 | 0 | 0 | 0 | 0 |

US 7,535,764 B2

ADJUSTING RESISTANCE OF NON-VOLATILE MEMORY USING DUMMY MEMORY CELLS

CROSS-REFERENCE TO RELATED APPLICATIONS

The following application is cross-referenced and incorporated by reference herein in its entirety: U.S. patent application Ser. No. 11/688,875, titled "Apparatus that Adjusts Resistance of Non-Volatile Memory Using Dummy Memory Cells," Inventors Henry Chin, Nima Mokhlesi and Dengtao Zhao, filed Mar. 21, 2007.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determined whether the memory cell(s) being programmed have reached their target level. If a memory cell has reached its target level, programming stops for that memory cell. If a memory cell has not reached its target level, programming will continue for that memory cell.

One example of a flash memory system uses the NAND structure, which includes arranging multiple transistors in series between two select gates. The transistors in series and the select gates are referred to as a NAND string.

In a typical NAND flash memory device, memory cells are programmed in a certain order wherein the memory cells on the word line that is next to the source side select gate are programmed first. Subsequently, the memory cells on the adjacent word line are programmed, followed by the programming of memory cells on the next adjacent word line, and so on, until the memory cells on the last word line next to the drain side select gate are programmed.

As more memory cells in a NAND string are programmed, the conductivity of the channel areas under the unselected word lines will decrease because programmed memory cells have a higher threshold voltage than memory cells that are in the erased state. This increasing of channel resistance changes the IV characteristics of the memory cells. When a particular memory cell was being programmed (and verified), all the memory cells on the word lines higher (closer to the drain side select gate) than the selected word line were still in the erased state. Therefore, the channel area under those word lines was conducting very well, resulting in a relatively high cell current during the actual verify operation. However, after all memory cells of the NAND string have been programmed to their desired state, the conductivity of the channel area under those word lines usually decreases as most of the cells will be programmed to one of the programmed states (while a smaller number will stay in the erased state). As a result, the IV characteristics during a subsequent read operation will be different, since less current will flow than compared to previous verify operations performed during programming. The lowered current causes an artificial shift of the threshold voltages for the memory cells, which can lead to errors when reading data.

SUMMARY OF THE INVENTION

In some non-volatile storage systems, a block of data memory cells is manufactured with a dummy word line at the bottom of the block, at the top of the block, and/or at other locations. By selectively programming memory cells on the dummy word lines, the resistances of the NAND strings (or other groups of memory cells) can be changed to account for shifts in resistance due to programming of data into the NAND strings (or other groups of memory cells).

In one example, the read process can be designed to account for a predicted amount of change to the resistance of a NAND string due to programming data into the memory cells of the NAND string. However, it is not always possible to predict what data will be stored in the memory cells; therefore, the programming of the memory cells on a NAND string may cause the actual change in resistance of the NAND string to deviate from the predicted amount of change in resistance of the NAND string. The memory cells connected to the dummy word line (herein after called dummy memory cells) can be programmed such that they can alter the actual change in resistance of the NAND string to be closer to the predicted amount of change to the resistance of a NAND string.

One embodiment includes determining information indicative of a resistance characteristic for a set of non-volatile storage elements. The set of non-volatile storage elements includes data non-volatile storage elements and dummy non-volatile storage elements. The process further includes programming the data non-volatile storage elements and setting one or more dummy non-volatile storage elements based on the determined resistance information.

Another embodiment includes determining information about group resistance for a set of non-volatile storage elements (including data and dummy non-volatile storage elements), programming the data non-volatile storage elements, and adjusting the group resistance by changing a characteristic of the one or more dummy non-volatile storage elements based on the determined information.

Another embodiment includes determining deviation of change in resistance for at least a subset of a set of data non-volatile storage elements with respect to a predefined change. For a given data non-volatile storage element, the change in resistance is based on pre and post programming of other data non-volatile storage elements. The set of non-volatile storage elements includes data non-volatile storage elements and one or more dummy non-volatile storage elements. The process also includes identifying a minimum deviation and a maximum deviation based on the determining of the deviation of change in resistance, and determining a condition for one or more of the dummy non-volatile storage elements that alter the minimum deviation and the maximum deviation in accordance with an error reduction criteria. The resistance for the set of non-volatile storage elements is altered by setting the one or more of the dummy non-volatile storage elements to the determined condition.

Another embodiment includes determining information indicative of a resistance characteristic for a set of non-volatile storage elements. The set of non-volatile storage elements includes data non-volatile storage elements and dummy non-volatile storage elements. The data non-volatile storage elements are programmed, including performing verify operations. The verify operations uses a first overdrive voltage for unselected data non-volatile storage elements and a second overdrive voltage for dummy data non-volatile storage elements. The first overdrive voltage is lower than the second overdrive voltage. One or more dummy non-volatile storage elements have their threshold voltage set to be within in a range of threshold voltages near charge-neutrality for the dummy non-volatile storage elements based on the determined resistance information.

One example implementation includes a set of non-volatile storage elements and one or more managing circuits in communication with the set of non-volatile storage elements. The set of non-volatile storage elements includes data non-volatile storage elements and dummy non-volatile storage elements. The one or more managing circuits perform the processes described above.

DETAILED DESCRIPTION

Figure 1:
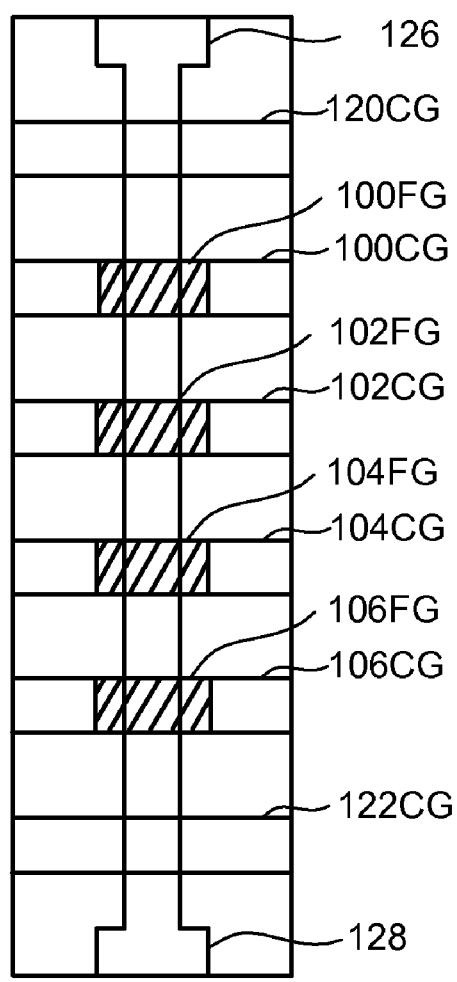
FIG. 1 is a top view of a NAND string.
Figure 2:
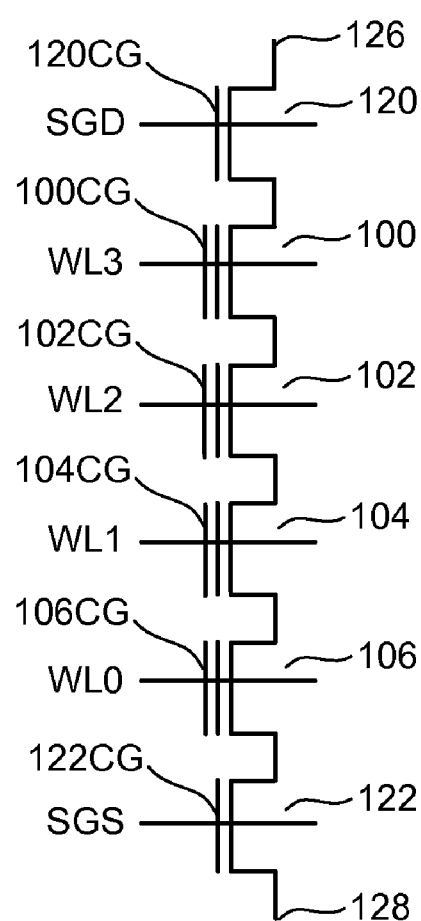
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data (referred to as a binary memory cell), the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011""100", "101", "110"and "111".

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456, 528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
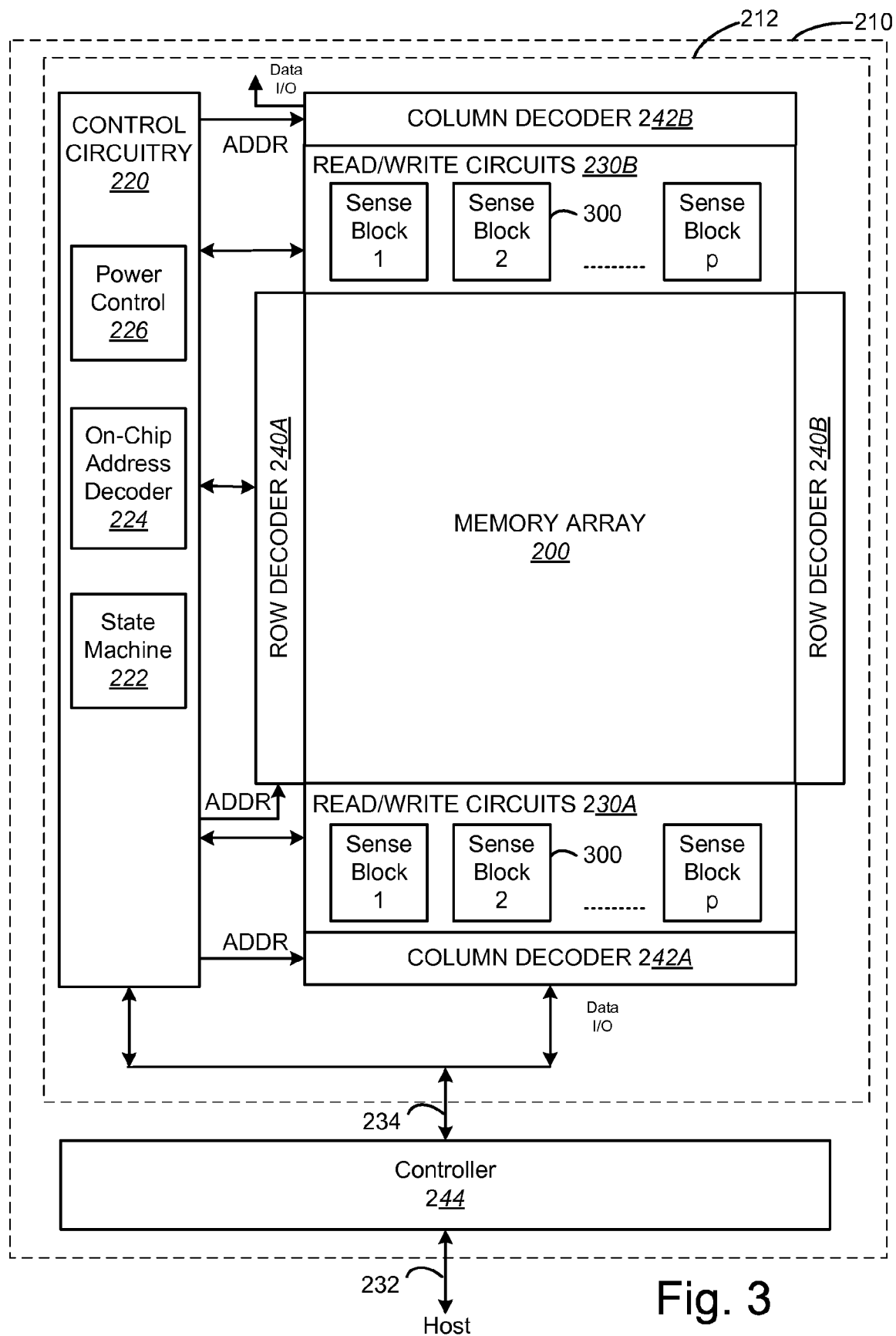
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
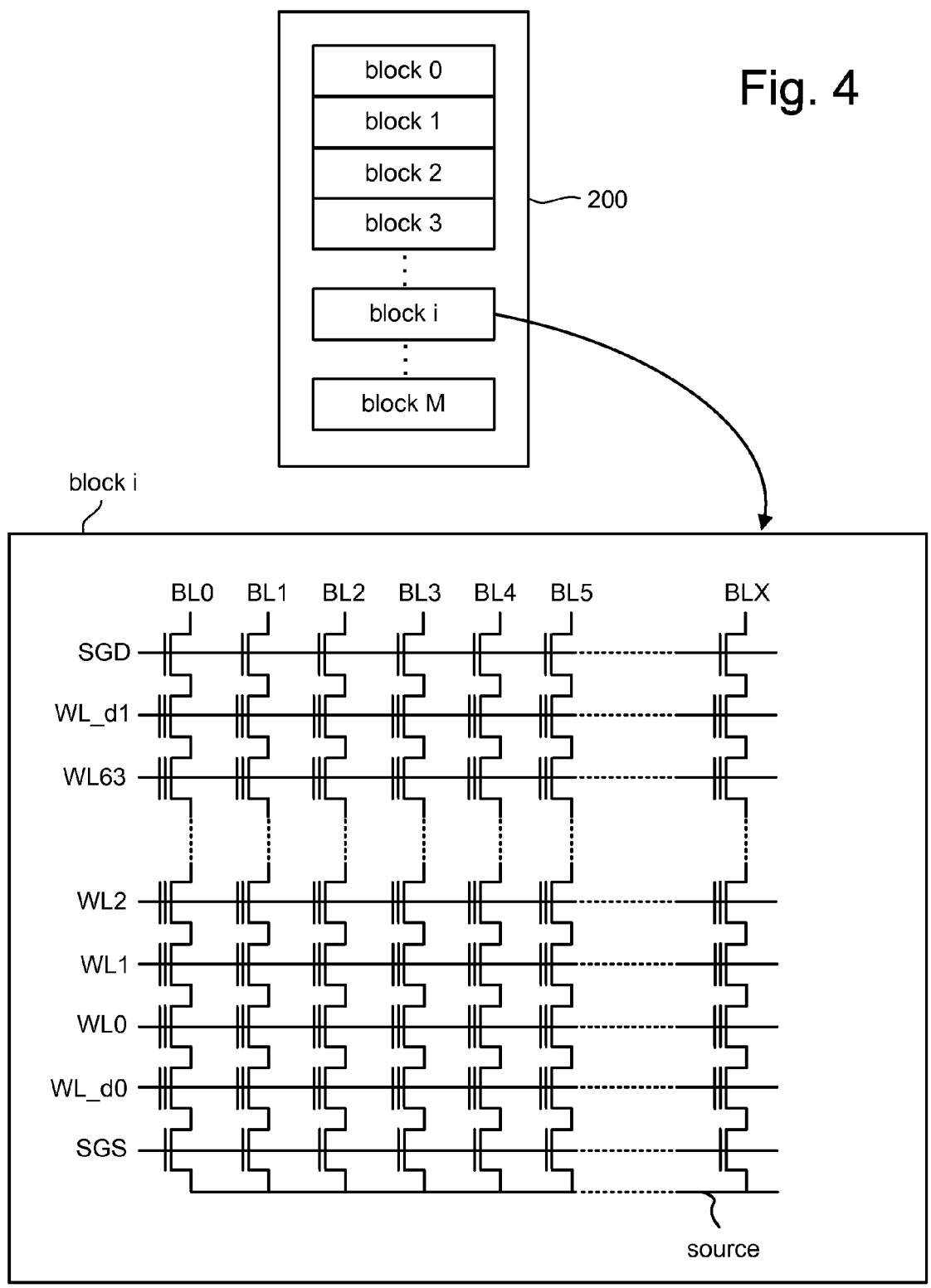
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data.

Figure 5:
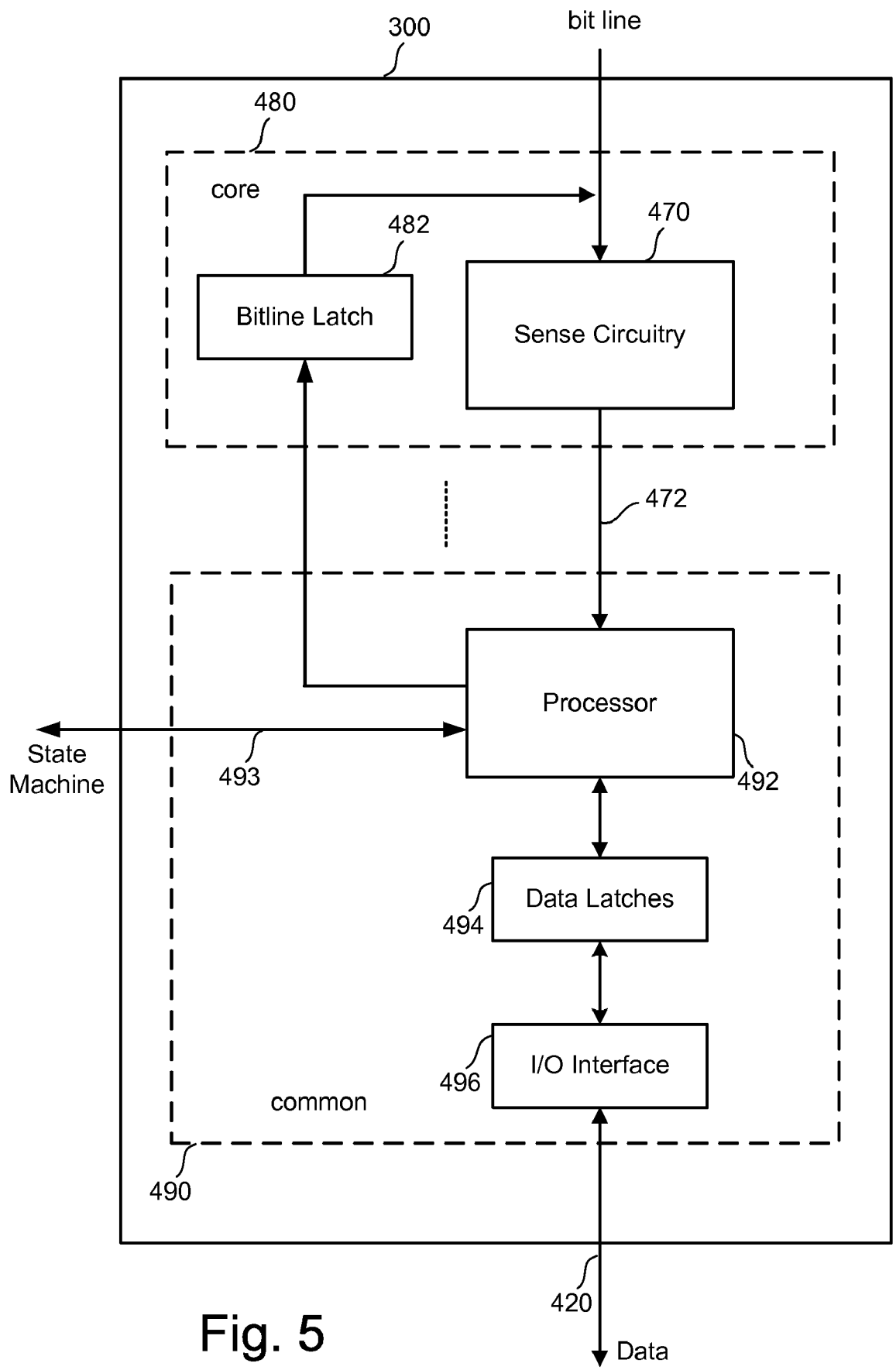
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cemea, filed on Dec. 28, 2005. All five of the immediately above-listed patent documents are incorporated herein by reference in their entirety.

Figures 6, 7, 8:
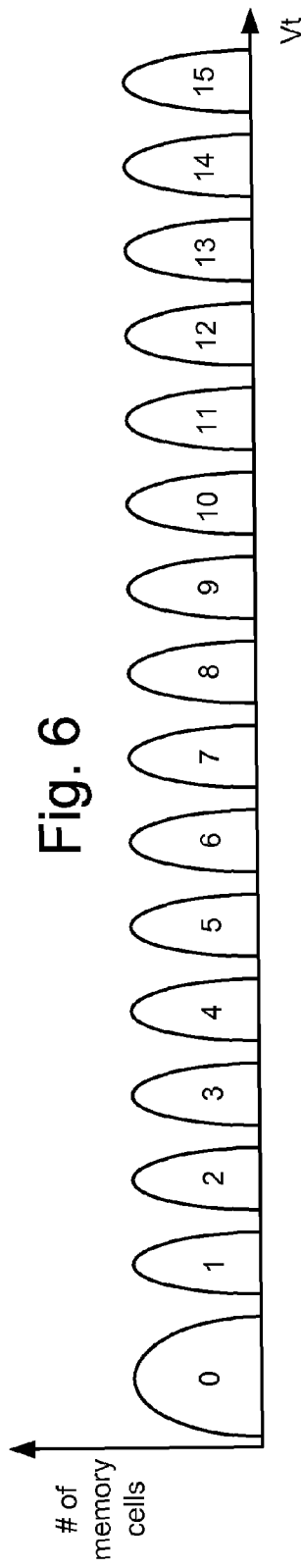
FIG. 6 depicts an example set of threshold voltage distributions.
FIG. 7 depicts an example coding of data into a set of data states associated with threshold voltage distributions.
FIG. 8 depicts an example coding of data into a set of data states associated with threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions corresponding to data states for the memory cell array when each memory cell stores four bits of data. Other embodiment, however, may use more or less than four bits of data per memory cell. FIG. 6 shows a first threshold voltage distribution or state 0 for erased memory cells. Fifteen threshold voltage distributions or states 1-15 for programmed memory cells are also depicted. In one embodiment, the threshold voltages in state 0 are negative and the threshold voltages in the states 1-15 are positive.

Between each of the data states 0-15 are read reference voltages used for reading data from memory cells. By testing whether the threshold voltage of a given memory cell is above or below the respective read reference voltage, the system can determine what state the memory cell is in.

At or near the lower edge of each data state 1-15 are verify reference voltages. When programming memory cells to a given state, the system will test whether those memory cells have a threshold voltage greater than or equal to the verify reference voltage.

In some embodiments, the data states 0-15 can partially overlap since the ECC can handle a certain percentage of cells that are in error. Also note that the Vt axis may be offset from actual voltages applied to the control gates as body effect through source or body biasing is used to shift negative threshold voltage into the measurable positive range. Another point to note is that contrary to the equal spacing/width of the shown 16 states, various states may have different widths/spacings in order to accommodate varying amounts of susceptibility to retention loss.

Each data state of FIG. 6 corresponds to predetermined values for the data bits stored in the memory cells programmed to the respective states. FIG. 7 is a table providing an example of the data values assigned to each data state 0-15. In one embodiment, a memory cell stores data in four different pages. The four pages are referred to as the lower page, upper page, higher page and top page. FIG. 7 depicts the data in each page for each data state 0-15. In one embodiment, each page is programmed separately. In another embodiment, all four data bits for a memory cells are programmed at the same time.

FIG. 8 is a table providing another example of the data values assigned to each data state 0-15. The data values of FIG. 8 utilize a Gray code assignment so that only one bit changes between neighboring data states. This arrangement reduces the number of error bits if the threshold voltage of a memory cells is too low or too high.

Figure 9:
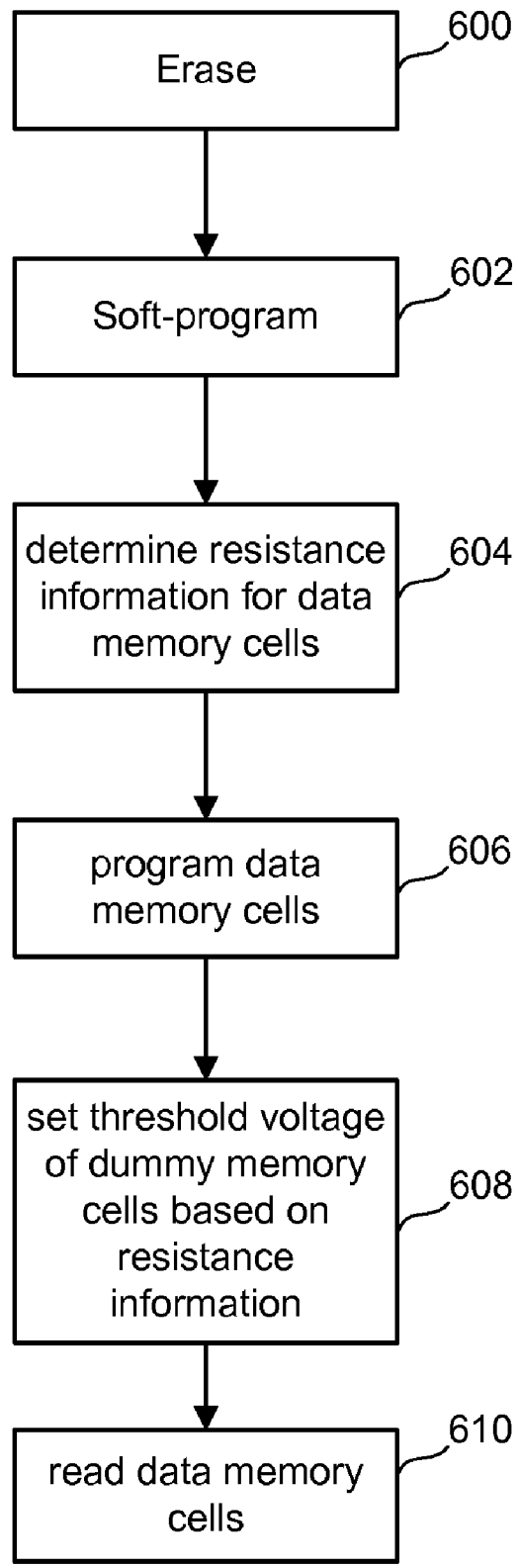
FIG. 9 is a flow chart describing one embodiment for operating non-volatile memory cells.

FIG. 9 is a flow chart describing one embodiment for operating non-volatile memory cells. In many implementations, memory cells are erased (in blocks or other units) prior to programming. Memory cells are erased (see step 600), in one embodiment, by raising the p-well to an erase voltage (e.g., 20 volts) for a sufficient period of time and grounding the word lines of a selected block while the source and bit lines are floating. Due to capacitive coupling, the unselected word lines, bit lines, select lines, and source are also raised to a significant fraction of the erase voltage. A strong electric field is thus applied to the tunnel oxide layers of selected memory cells and the data of the selected memory cells are erased as electrons of the floating gates are emitted to the substrate side, typically by a Fowler-Nordheim tunneling mechanism. As electrons are transferred from the floating gate to the p-well region, the threshold voltage of a selected cell is lowered. Erasing can be performed on the entire memory array, a block, or another unit of cells. After the block of memory cells is erased, the various memory cells can be programmed as described herein.

In step 602, soft programming is optionally performed to narrow the distribution of erased threshold voltages for the erased memory cells. Some memory cells may be in a deeper erased state than necessary as a result of the erase process. Soft programming can apply small programming pulses to move the threshold voltage of the erased memory cells to a tighter threshold voltage distribution.

In step 604, resistance information is determined for the data cells of each NAND string. There are many different embodiments for performing step 604, and different information can be determined that indicates different characteristics related to resistance. For example, step 604 can include directly measuring resistance (absolute or relative value) or measuring a property or data that can be used to determine information directly or indirectly about resistance (absolute or relative value). More details of some of the different embodiments are provided below. The invention described herein is not limited to any specific method of determining resistance information or any specific set of information indicative of a resistance characteristic. In one embodiment, the step of determining the resistance is performed by, or at the direction of, the controller. In other embodiments, the step of determining the resistance is performed by, or at the direction of, the state machine or another component.

In step 606, the data memory cells are programmed with data (e.g., user data). For example, multiple pages of data are programmed into the memory cells connected to WL0-WL63. In step 608, the threshold voltages of the dummy memory cells are set based on the resistance information determined in step 604. Setting the threshold voltages of the dummy memory cells can, in some embodiments, include performing one or more programming operations. For example, the memory cells connected to WL_d0 and/or WL_d1 can be subjected to programming and the programming could put the dummy memory cells into any of the data states 0-15. Alternatively, the dummy memory cells can have their threshold voltage set to any of a number of analog levels.

Changing the threshold voltage of a dummy memory cell changes the resistance of the NAND string that the dummy memory cell is a part of. Increasing the threshold voltage of the dummy memory cell increases the resistance of the NAND string. Decreasing the threshold voltage of the dummy memory cell decreases the resistance of the NAND string.

Note that step 604 can be performed on a NAND string-by-NAND string basis (e.g., bit line-by-bit line basis), thereby, determining resistance information for each NAND string. Consequently, in one embodiment, the threshold voltage for each of the dummy memory cells can be individually set. By selectively programming memory cells on the dummy word lines, the resistances of the NAND strings can be individually tuned to account for changes in their individual resistance due to programming of data into the respective NAND strings.

The steps of FIG. 9 need not be performed in the order depicted. For example, steps 604 and 608 could be performed before, after, or during step 606. In some cases, the controller knows the user data before it is programmed into the data memory cells; therefore, step 604 can be performed prior to step 606. For example, the controller may buffer the data before programming. In another example, the controller may initially program the data into multiple blocks of memory cells as binary data (one bit of data per memory cell). After enough data is stored as binary data, the data is then re-programmed into a single block as multi-level (or multi-state) data. Prior to programming the data into a single block as multi-level (or multi-state) data, the controller has access to the data in the multiple blocks of binary data. In other cases, the controller does not know the user data before it is programmed into the data memory cells; therefore, step 604 is performed after step 606.

In step 610, the data memory cells are read and the data read is provided to the user. For example, data from the memory cells is provided to a host by the controller. Because the dummy memory cells were programmed as explained above, the error introduced from a change in resistance due to programming the data word lines is reduced for the process of reading data.

In general, during the read and verify operations, the selected word line is connected to a voltage, a level of which is specified for each read and verify operation in order to determine whether a threshold voltage of the concerned memory cell has reached such level. The non-selected word lines are connected to an overdrive voltage (referred to as Vread) different from that of the selected word line. The overdrive voltage is typically chosen to be higher than the maximum threshold voltage that can be programmed to a data memory cell. The difference between the overdrive voltage and the threshold voltage can also be referred to as the over-drive. After applying the word line voltage to the selected word line, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge a voltage on the bit line. The charge on the bit line is measured after a period of time to see whether it has been discharged or not.

Figure 10:
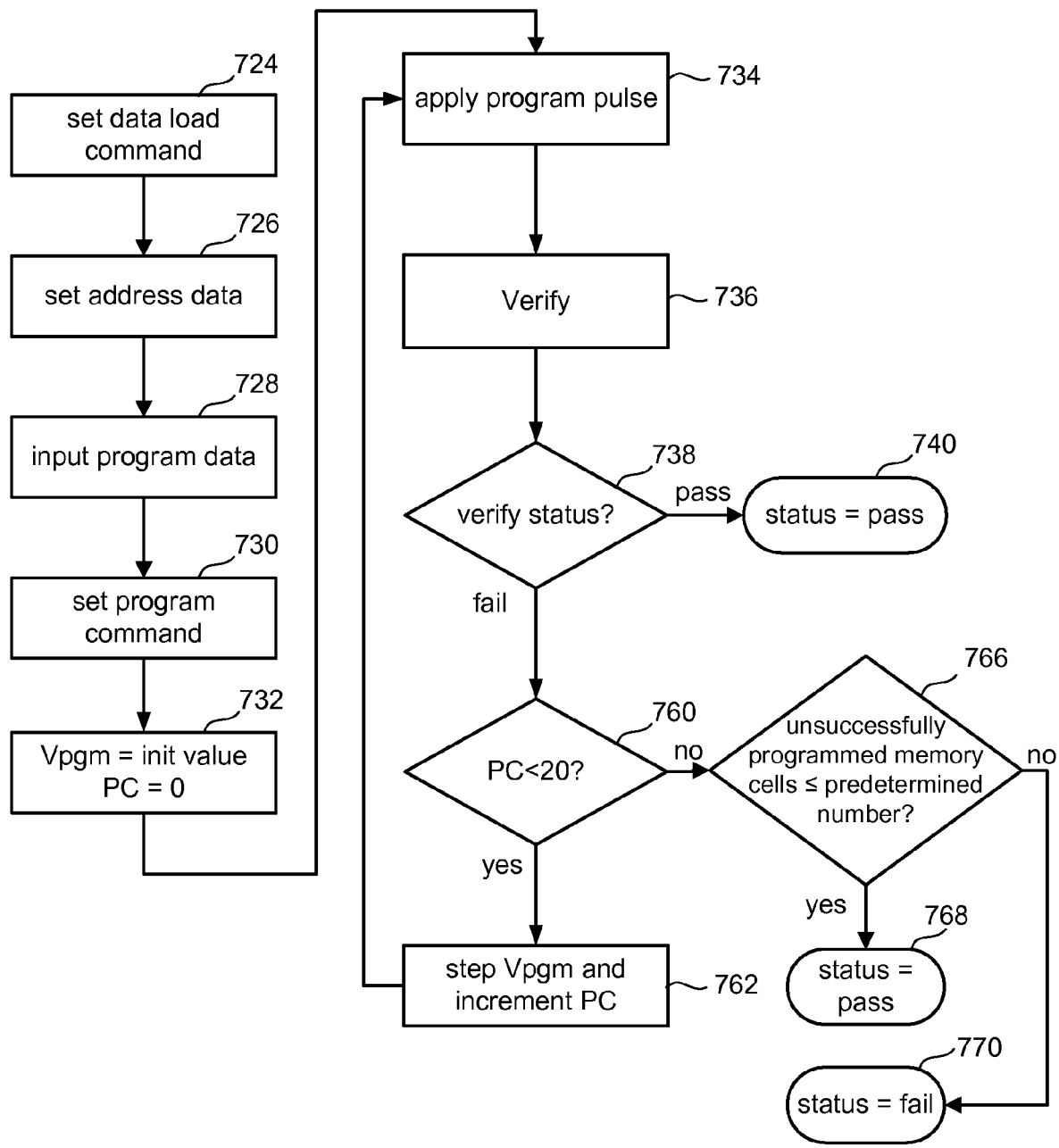
FIG. 10 is a flow chart describing one embodiment of a process for programming non-volatile memory cells.

FIG. 10 is a flow chart describing a programming process for programming memory cells connected to a selected word line. Many different programming techniques can be used with the present invention. In one embodiment, the process of FIG. 10 is performed by and/or at the direction of control circuitry 220 (state machine 222 provides the control and power control 226 provides the appropriate signals) and/or at the direction of controller 244. Because a programming process may include programming multiple pages, the programming process may include performing the process of FIG. 10 multiple times. The process of FIG. 10 can be used to perform step 606 and step 608 of FIG. 9.

Note that in some embodiments (but not all), memory cells are programmed from the source side to the drain side. For example, looking at FIG. 4, word line WL0 is programmed first, followed by programming WL1, followed by programming WL2, etc.

In step 724, a "data load" command is issued by controller 244 and input to state machine 222. In step 726, address data designating the page address is provided to the decoder circuitry. In step 728, a page of program data for the addressed page(s) is input for programming. For example, 528 bytes of data could be input in one embodiment. That data is latched in the appropriate registers/latches for the selected bit lines. In some embodiments, the data is also latched in a second register for the selected bit lines to be used for verify operations. In step 730, a "program" command is received from controller 244 and provided to state machine 222.

Triggered by the "program" command, the data latched in step 728 will be programmed into the selected memory cells controlled by state machine 222 using a set of pulses applied to the appropriate word line. In step 732, Vpgm, the programming voltage signal (e.g., the set of pulses), is initialized to the starting magnitude (e.g., ~12V or another suitable level) and a program counter PC maintained by state machine 222 is initialized at 0. In step 734, a pulse of the program signal Vpgm is applied to the selected word line.

In step 736, the data states of the selected memory cells are verified using the appropriate set of target levels. If it is detected that the threshold voltage of a selected memory cell has reached the appropriate target level, then the memory cell is locked out of future programming for the remainder of the process of FIG. 10 by raising its bit line voltage. If all memory cells being programmed have reached their target data states (step 738), then the programming process is complete and successful. A status of "PASS" is reported in step 740. Note that in some implementations of step 738, it is checked whether at least a predetermined number of memory cells have been verified to have reached their target states. This predetermined number can be less than the number of all memory cells, thereby allowing the programming process to stop before all memory cells have reached their appropriate verify levels. The memory cells that are not successfully programmed can be corrected using error correction during the read process.

If, in step 738, it is determined that not all of the memory cells have reached their target states, then the programming process continues. In step 750, the program counter PC is checked against a program limit value. One example of a program limit value is 20; however, other values can be used in various implementations. If the program counter PC is not less than the program limit value, then it is determined in step 766 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 768. In many cases, the memory cells that are not successfully programmed can be corrected using error correction during the read process. If, however, the number of unsuccessfully programmed memory cells is greater than the predetermined number, the program process is flagged as failed and a status of FAIL is reported in step 770. If, in step 760, it is determined that the program counter PC is less than the program limit value, then the magnitude of the next Vpgm pulse is increased by the step size (e.g., 0.2-0.4 volt step size) and the program counter PC is incremented in step 762. After step 762, the process loops back to step 734 to apply the next Vpgm pulse.

Figure 11:
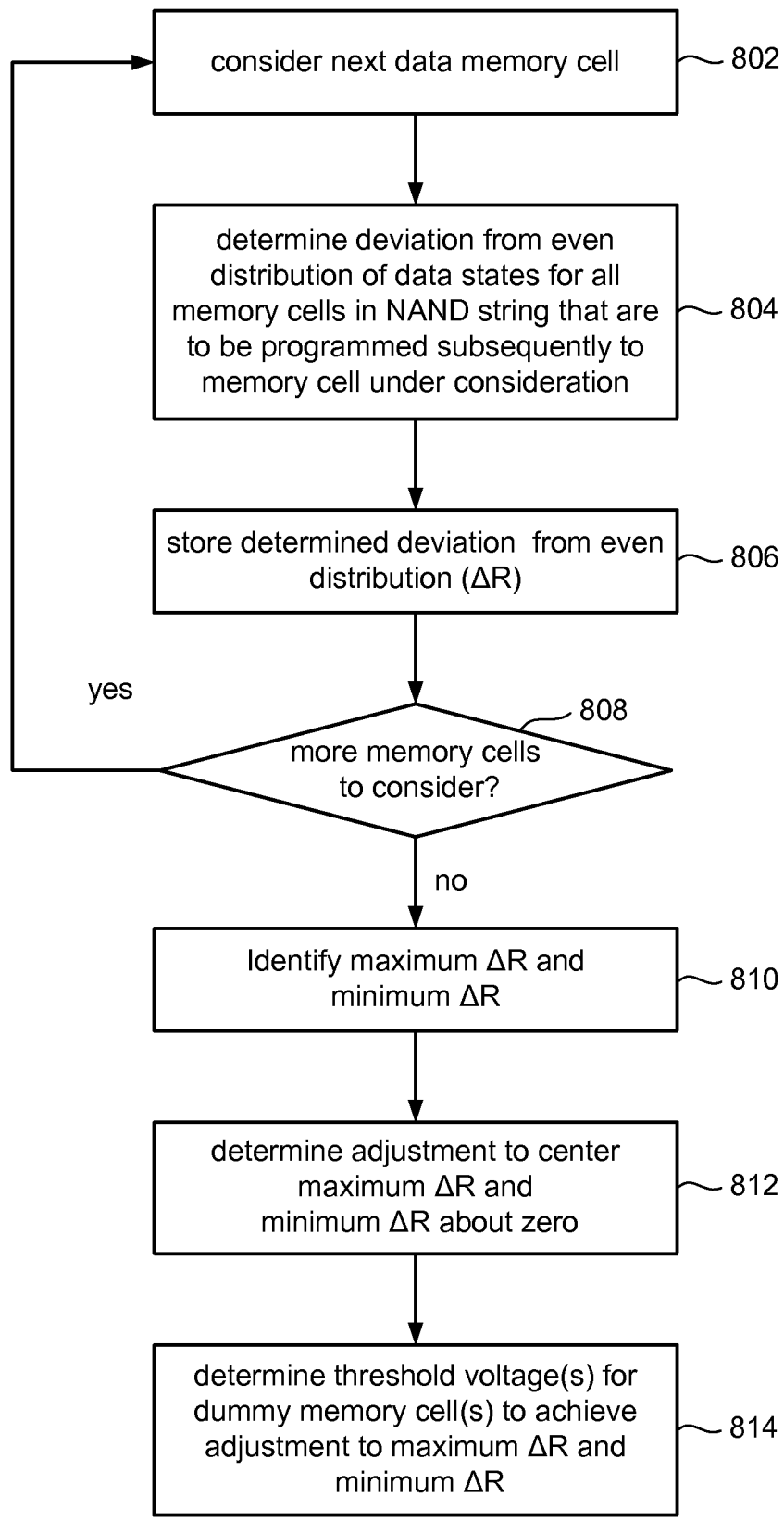
FIG. 11 is a flow chart describing one embodiment of a process for determining resistance information for data non-volatile memory cells.

FIG. 11 is a flow chart describing one embodiment of a process for determining resistance information for data non-volatile memory cells (step 604 of FIG. 9). The process of FIG. 11 is performed individually (and in some cases simultaneously) for each NAND string. In step 802, the next data memory cell is considered. If this is the first time that step 802 is being performed, then the first data memory cell (e.g., connected to WL0) of the NAND string is accessed.

In step 804, the system characterizes change of resistance experienced by the data memory cells on the NAND string that is currently under consideration. Each memory cell experiences a change in resistance relative to all of the memory cells programmed subsequent to that memory cell. For example, the memory cell connected to WL3 will experience a change in resistance due to the programming of the memory cells connected to WL4-WL63. The change in relative resistance will be with respect to before the memory cells on WL4-WL63 are programmed in comparison to after the memory cells connected to WL4-WL63 are programmed. There are many ways to measure this change in resistance. One method is to measure the actual resistance values. Another embodiment is to estimate the change of resistance based on the data programmed into the memory cells. Other methods can also be used.

The embodiment of FIG. 11 characterizes the change in resistance based on the data programmed into the memory cells. The change of resistance is characterized by comparing the actual data programmed to an even distribution of data and determining the deviation from the even distribution. An even distribution of data exists when all data states are represented equally (or as close to equal as possible). In an example where there are sixty-four data memory cells on a NAND string and sixteen data states, each data state will appear four times on a NAND string if there is an even distribution of data. Step 804 will characterize the difference between the actual data programmed and an even distribution of data, and use that difference to program the dummy memory cells.

The effects on resistance of an even distribution of data can be known in advance. Engineers can simulate or test the actual resistance change due to an even distribution of data being programmed to a NAND string. Based on that information, the read process can be adjusted to account for the change in resistance from the even distribution. For example, U.S. patent application Ser. No. 11/421,667, "Verify Operation For Non-Volatile Storage Using Different Voltages," filed on Jun. 1, 2006, incorporated herein by reference in its entirety, describes a system that when performing a data sensing operation, including a verify operation during programming of non-volatile storage elements, a first voltage is used for unselected word lines that have been subjected to a programming operation and a second voltage is used for unselected word lines that have not been subjected to a programming operation. This system accounts for the change of resistance during programming and can be tuned to account for an even distribution of data. The technique can also be used during read operations.

Another example is provided in U.S. patent application Ser. No. 11/421,871, "Data Pattern Sensitivity Compensation Using Different Voltage," filed on Jun. 2, 2006, incorporated herein by reference in its entirety. This application depicts a system that when performing a data sensing operation, including a verify operation during programming of non-volatile storage elements, a first voltage is used for unselected word lines that have been subjected to a programming operation, a second voltage is used for unselected word lines that have not been subjected to a programming operation, and a third voltage is used for the unselected word lines that has not been subjected to a programming operation and is adjacent to the selected word line. The neighbor word line can also be separately adjusted during reading. This system can be tuned to account for an even distribution of data. Other techniques to account for changes in resistance due to an even distribution of data can also be used.

In step 804, the system determines the deviation from an even distribution of data. For the data memory cell under consideration, step 804 looks at all the memory cells programmed subsequent to that memory cell. For example, if the memory cell connected to WL3 is under consideration, then step 804 will include looking at all the memory cells connected to WL4-WL63. The system can characterize the deviation from the even distribution in many different ways. One example is to assign a number value to each data state; for example, data state 0 is assigned 0, data state 1 is assigned 1, data state 2 is assigned 2, data state 3 is assigned 3, . . . , data state 15 is assigned 15. The system can add up the assigned numbers for each data state of actual data and divide by the number of memory cells. Thus an average will be calculated. That average can be compared to the average for the even distribution. The difference from the actual average and the average for the even distribution is one example of information indicative of a resistance characteristic (other examples include actual resistance, relative resistance, other data values described herein, as well as others). Step 804 performs the calculation to determine the deviation value for one data memory cell on a NAND string and that determined deviation value is stored in step 806. In step 808, it is determined whether there are any more memory cells on the NAND string to consider. If there are more memory cells on the NAND string to consider, the process loops back to step 802 and considers the next memory cell. Thus, the loop of steps 802-806 is performed once for each memory cell on the NAND string. After there are no more memory cells on the NAND string to consider (step 808), then the maximum deviation and the minimum deviation are identified in step 810.

In step 812, the system determines an adjustment to both the maximum deviation and the minimum deviation so that the minimum deviation is below zero change, the maximum deviation is above zero change, the difference between maximum deviation and zero change is minimized, and the difference between the minimum deviation and zero change is minimized. In step 814, the system determines the threshold voltages to program the dummy memory cells in order to achieve the adjustment of step 812. Note that centering the minimum and maximum deviation about zero change with respect to the average is just one example of an error reduction criterion that can be used. Other error reduction criteria can also be used.

The reason for adjusting the maximum deviation and minimum deviation to be about zero change is because zero change represents the even distribution. Thus, the adjustment represents the difference in resistance between the actual data and the even distribution of data. By programming the dummy memory cells, the resistance to the NAND string can be changed. Thus, programming the dummy memory cells based on the adjustments of step 812 seeks to change the resistance of NAND string to move toward a resistance for a NAND string with an even distribution. As stated above, the read process is equipped to account for change in resistance due to an even distribution of data.

In one embodiment, if the NAND string has its maximum deviation and minimum deviation both equal to zero, then the NAND string is the even distribution and both dummy memory cells (WL_d0 and WL_d1) are set to be in data state 7. That is, the threshold voltage of the dummy memory cells are raised so that they are in the threshold voltage distribution corresponding to data state 7. If the NAND string has data resulting in a lower resistance than the even distribution, then the resistance to the NAND string can be increased by programming the dummy memory cells to a data state higher than 7. If the NAND string has a resistance greater than the even distribution, then the resistance of the NAND string can be lowered by programming the dummy memory cells to a state lower than data state 7. In one embodiment, dummy memory cells will only be programmed into data state 0, 7 and 15. In other embodiments, the memory cells can be programmed into any of the data states, thereby, providing more resolution in how the resistance of the NAND string is tuned. In yet another embodiment, the threshold voltage need not be programmed into a data state. Rather, the threshold voltage can be any analog value between zero and the maximum allowed threshold voltage. In one example, the maximum allowed threshold voltage is at least 2 volts less than the overdrive voltage used on non-selected word lines during the read process.

In another embodiment, instead of centering the minimum and maximum deviations about zero, the dummy memory cells can be programmed to minimize the average of the square of the deviations for all of the memory cells on the NAND string. Alternatively, the system can seek to minimize the number of memory cells in the NAND string with resistance changes that fall outside a range of resistance changes that have negligible impact on the overall Vt distribution.

Note that the result of step 814 may call for a larger (or lower) dummy threshold than is possible. In such a case the dummy cell(s) are programmed to the maximum (or minimum) threshold voltage possible.

Figure 12A:
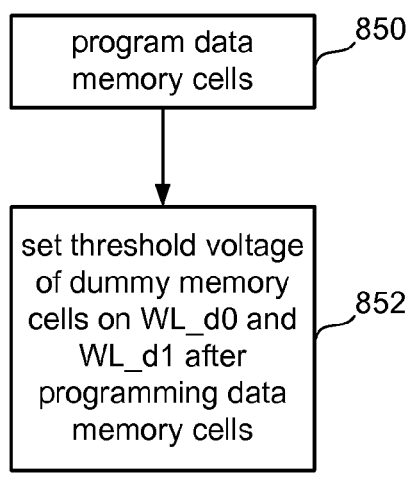
FIGS. 12A-D are flow charts describing various embodiments for programming data non-volatile memory cells and setting threshold voltages for dummy non-volatile memory cells.

FIGS. 12A-12D provide various embodiments describing the order of programming the data memory cells and setting the threshold voltages for the dummy memory cells. FIG. 12A provides an example that includes the dummy memory cells being programmed after the data memory cells. In step 850, all the data memory cells are programmed. In step 852, the threshold voltage for the dummy memory cells are set after programming the data memory cells. Because the dummy memory cells are programmed after the programming of the data memory cells, the process of FIG. 11 can be performed by looking at the actual data in the memory cells. On the other hand, FIG. 11 can also be performed based on data the controller has stored in a buffer or in other blocks (as described above).

Figure 12B:
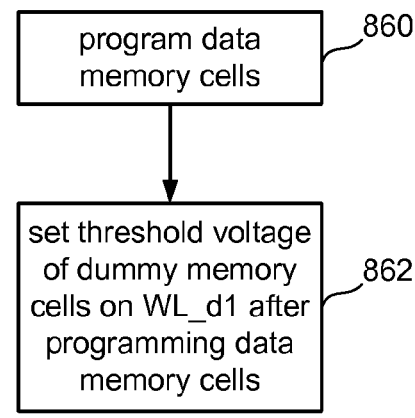

FIG. 12B describes an embodiment that uses only one of the dummy memory cells per NAND string. In step 860, all the data memory cells are programmed. In step 862, the threshold voltage for the one dummy memory cell per NAND string is set. In one embodiment, the one dummy memory cell is on word line WL_d1. In some embodiments, there could be many dummy word lines, however, only a subset of dummy word lines are used to effect resistance. In some embodiments, the determination of which dummy word line to use to effect resistance can be made dynamically.

Figure 12C:
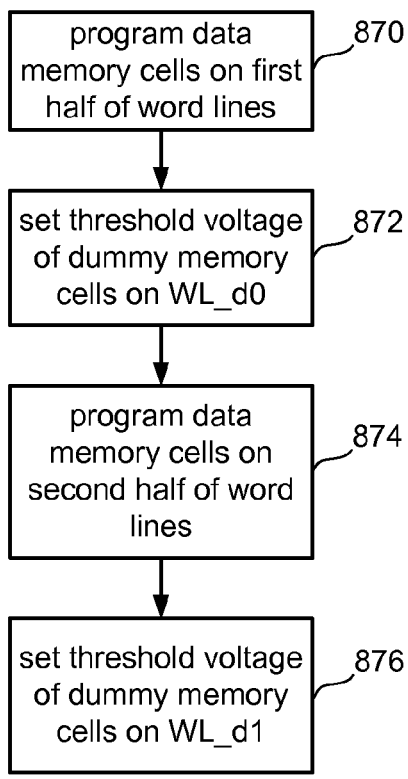

FIG. 12C describes an embodiment where (for a NAND string) one dummy memory cell is programmed after a subset of the data memory cells have been programmed and the other dummy memory cell is programmed after programming all the data memory cells. In step 870, the system programs data memory cells for the first half (or different fraction) of the word lines (e.g. WL0-WL31). In step 872, the threshold voltage for each of the dummy memory cell(s) connected to WL_d0 are set. In step 874, the remaining data memory cells are programmed (e.g. for WL32-WL63). In step 876, the system sets the threshold voltage(s) for the dummy memory cells connected to WL_d1.

In one variation of the process of FIG. 12C, the controller has access to all of the data for all of the word lines at the time of performing step 872; therefore, the dummy memory cells connected to WL_d0 are set based on data for all of the word lines. In another embodiment, the controller (or other relevant entity) only has access to the data that has been programmed into the data memory cells in step 870. In the latter case, the dummy memory cells connected to WL_d0 are set based on the contents of the data memory cells connected to the first half (or different fraction) of the word lines (e.g. WL0-WL31). In step 876, the system sets the threshold voltage for the dummy memory cells connected to WL_d1 based on data for all of the word lines. These variations could apply to the process of FIG. 11 and other alternatives. Note that the change in resistance provided by a dummy memory cell will affect those data memory cells that were programmed before setting the threshold voltage of the dummy memory cell.

Figure 12D:
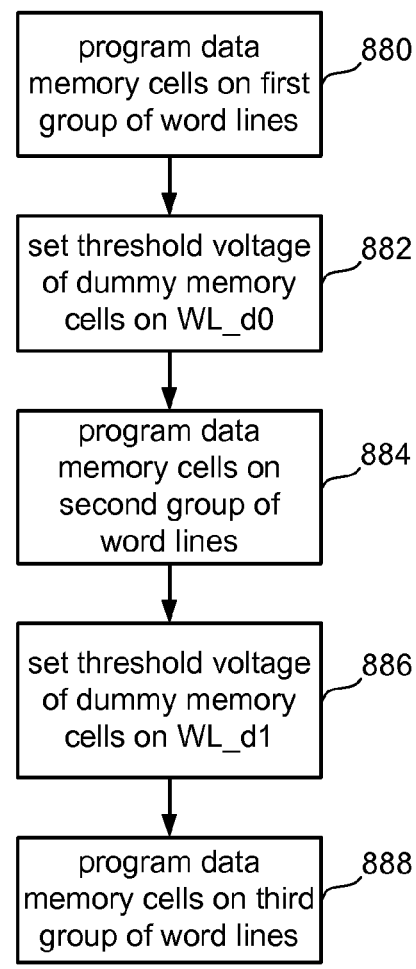

FIG. 12D provides another embodiment where all the dummy memory cells are programmed after starting to program the data memory cells and prior to completing programming of all data memory cells. In step 880, data memory cells are programmed for the first group of word lines. In step 882, the threshold voltages are set for dummy memory cells connected to WL_d0. In step 884, memory cells connected to the second group of word lines are programmed. In step 886, the threshold voltage is set for dummy memory cells connected to WL_d1. In step 888, memory cells connected to the third group of word lines are programmed. In one embodiment, the first group of word lines includes WL0-WL21, the second group of word lines includes WL22-WL42, and the third group of word lines includes WL43-WL63. In other embodiments, the three groups can include different members.

Figure 13:
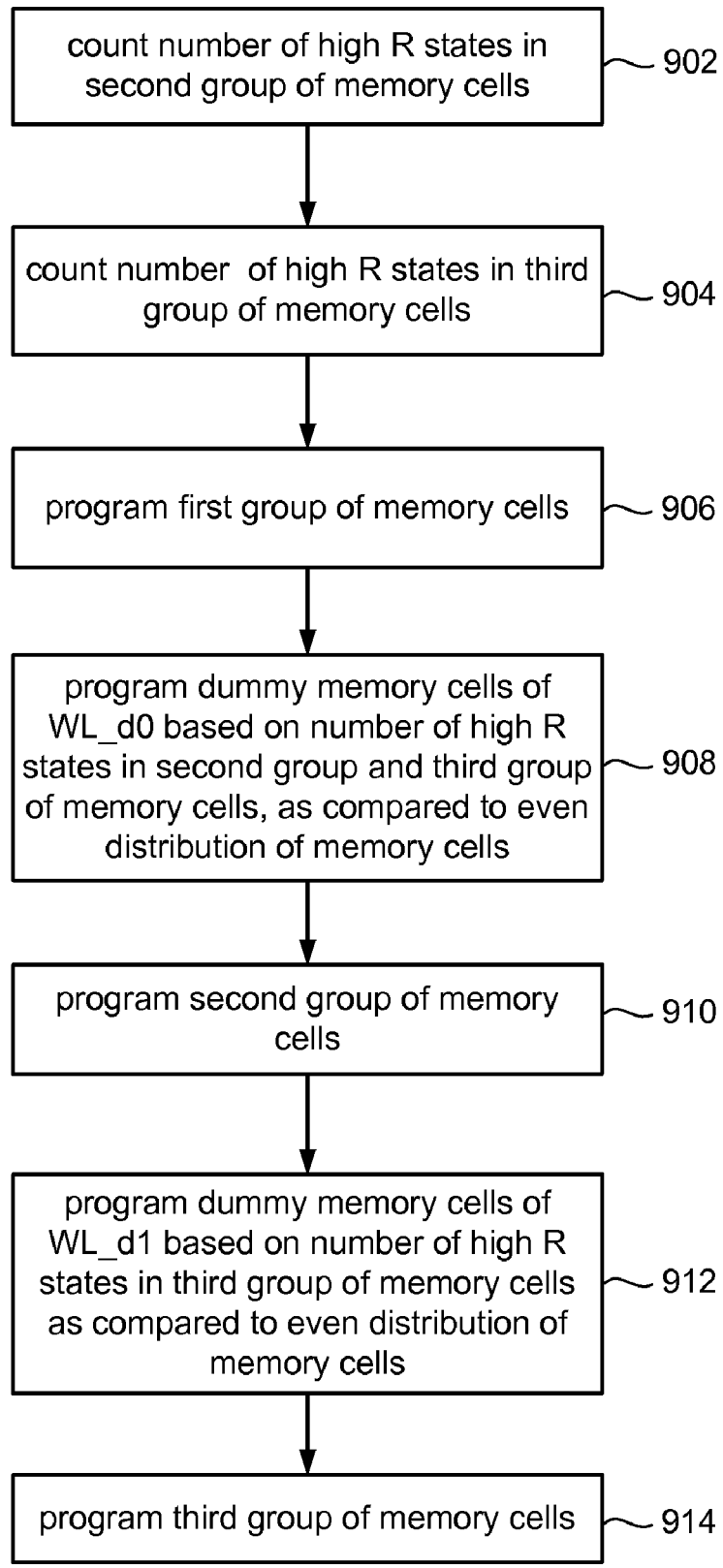
FIG. 13 is a flow chart describing one embodiment of a process for determining resistance information for data non-volatile memory cells, programming data non-volatile memory cells, and setting threshold voltages for dummy non-volatile memory cells.

FIG. 13 provides another embodiment of determining resistance information for data memory cells, programming the data memory cells, and setting the threshold voltage of the dummy memory cells based on the resistance information. In this embodiment, the change in resistance for a NAND string is estimated by the number of memory cells in a high data state. The NAND string can be broken up into three groups. The first group includes word lines WL0-WL21, the second group includes WL22-WL42 and the third group includes WL43-WL63. In step 902, the system determines the number of high data states in the second group of memory cells. Assume that states 12-15 are high data states. Thus, the system will count the number of memory cells in the second group that have data stored in data states 12-15. The high data states are associated with higher threshold voltages, which have a greater impact on resistance. In step 904, the system will count the number of memory cells in the third group that are in high data states. In step 906, the first group of memory cells will be programmed with user data. In step 908, the dummy memory cells connected to WL_d0 will be programmed based on the number of high data states in the second group and the third group of data memory cells. In one embodiment, the number of memory cells in the second group and third group that are in a high resistance state are compared to the number of memory cells that would be in the high resistance state for the even distribution. This deviation will be used to set the threshold voltage of the dummy memory cell to data state zero, data state 7 or data state 15. As described above, greater resolution can be achieved by using all the data states or an analog value. In step 910, the second group of memory cells are programmed. In step 912, dummy memory cells connected to WL_d1 are programmed based on the number of memory cells in the third group that are in the high data state as compared to the even distribution of cells. In step 914, the third group of data memory cells are programmed. In alternative embodiments, the high data state can include other sets of states, such as data states 8-15 or other grouping of data states. In another alternative of the process of FIG. 13, all of the dummy memory cells can all be programmed after all data memory cells are programmed, based on the deviation between the number of memory cells in group two and three (or just group three) as compared to the analogous set of data memory cells with an even distribution.

In another embodiment, the dummy memory cells connected to WL_d0 will be programmed (after the first group of data memory cells) based on the number of data memory cells in the first group that are in the high state. The dummy memory cells connected to WL_d1 will be programmed (after the all three groups of data memory cells) based on the number of data memory cells in all three groups that are in the high state.

Figure 14:
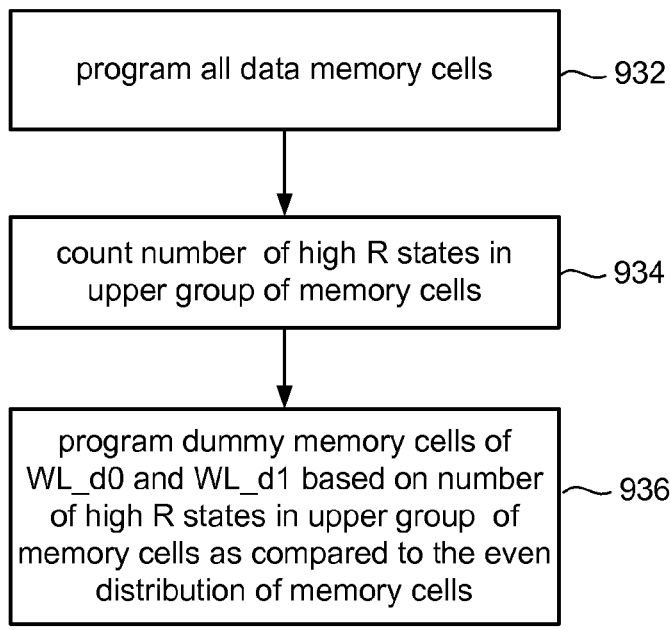
FIG. 14 is a flow chart describing one embodiment of a process for determining resistance information for data non-volatile memory cells, programming data non-volatile memory cells, and setting threshold voltages for dummy non-volatile memory cells.

FIG. 14 provides another embodiment for determining resistance information, programming data memory cells and setting the threshold voltage of dummy memory cells. In step 932, the data memory cells are programmed. In step 934, the system counts the number of data memory cells in the high data state. In one embodiment, the system will consider all the data memory cells. In another embodiment, the system only considers whether an upper group of data memory cells are in a high data state. The upper group of data memory cells can be the top half of word lines (e.g. WL32-WL63), the top one third of word lines, or other groupings. In step 936, the dummy memory cells are programmed or otherwise have their threshold voltage set based on the number of memory cells counted in step 934 as compared to the even distribution of memory cells.

Figure 15:
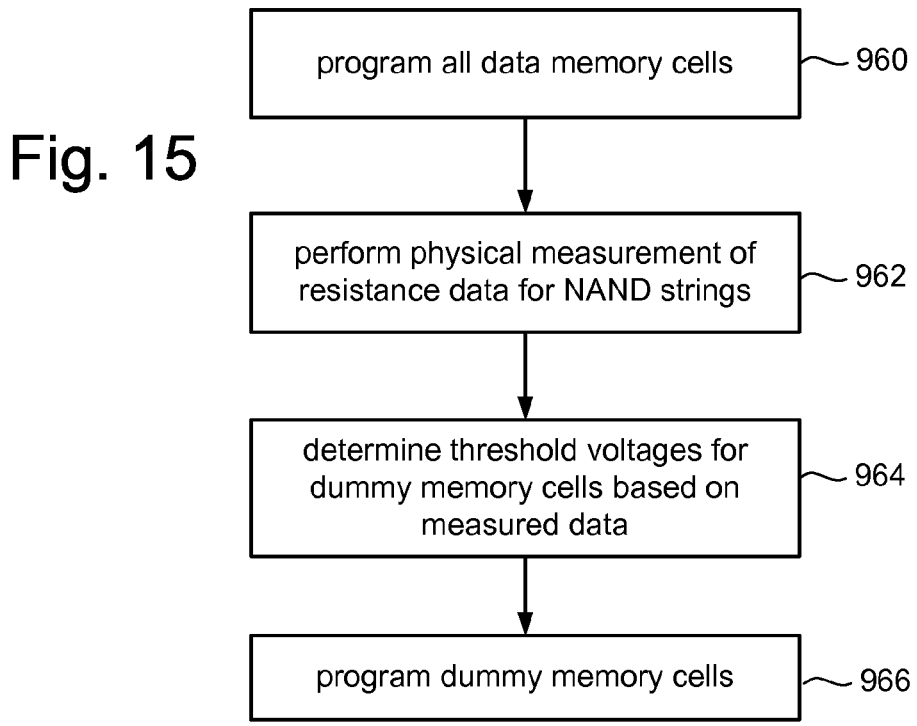
FIG. 15 is a flow chart describing one embodiment of a process for determining resistance information for data non-volatile memory cells, programming data non-volatile memory cells, and setting threshold voltages for dummy non-volatile memory cells.

FIG. 15 provides another embodiment for determining resistance information, programming data memory cells and, setting the threshold voltage for dummy memory cells. In step 960, data is programmed into all the data memory cells. In step 962, the system performs a physical measurement of resistance information for the NAND strings. There are many ways to physically measure resistance information. For example, to measure the resistance of one or more transistors (set A) in a NAND string, have their control gate voltage set to be relatively lower than the normal overdrive voltage used during a read process. For all other transistors (set B) on the NAND string, the control gate voltage is set to the normal overdrive voltage used during a read process. In this way, the resistances of set A will dominate the overall series resistance of the entire NAND string. The system can find the series resistance by setting the bit line voltage to some value and measuring the current. One embodiment is described in U.S. patent application Ser. No. 11/617,972, "Resistance Sensing and Compensation for Non-Volatile Storage," filed on Dec. 29, 2006, incorporated herein by reference in its entirety. In one alternative, set A could be the entire NAND string.

In step 964 of FIG. 15, target threshold voltages for the dummy memory cells are determined based on the measured resistance data from step 962. For example, the physical measurements can determine whether a particular NAND string is a high resistance or low resistance NAND string. If it is a low resistance NAND string, then the dummy memory cells can be programmed to data state twelve. If the NAND string is a high resistance NAND string, the dummy memory cells can be programmed to data state four. In step 966, the dummy memory cells are programmed based on the determined threshold voltage levels determined in step 964.

One advantage of all the embodiments discussed above is that, while all the dummy memory cells connected to a common dummy word line are programmed at the same time, they can be individually set to different states. Thus, each NAND string is individually tuned.

As described above, during a read or verify operations, the non-selected word lines are connected to an overdrive voltage that is typically chosen to be higher than the maximum threshold voltage that can be programmed to a data memory cell. The difference between the overdrive voltage and the threshold voltage is referred to as the overdrive. The resistance of a non-selected memory cell is a non-linear function of the overdrive. In particular, the resistance is very sensitive to the overdrive when the overdrive is close to zero, but relatively insensitive for large overdrive. Therefore, in one embodiment, the dummy memory cells are operated with overdrive close to zero. Consequently, the overdrive voltage for the dummy memory cells can be set to a lower voltage than for the typical data memory cell so that the overdrive voltage is closer to the threshold voltage of the dummy memory cell.

In one embodiment, the dummy memory cells can be programmed to a narrower range of threshold voltages when compared to data memory cells. For example, the dummy memory cells can have their threshold voltages set near the charge-neutrality condition of the floating gate, which is the condition where there are as many protons as electrons. By centering the range of dummy memory cell threshold voltages near the charge-neutrality condition of the floating gate, the impact of data retention and other reliability concerns is reduced. It is now easier to target a high resistance (i.e. low overdrive) state for the dummy memory cell, without incurring the reliability penalties of a highly-charged floating gate. In this embodiment, the dummy memory cells can have a lower overdrive voltage (as compared to data memory cells ) and have their threshold voltages set to the charge-neutrality condition, slightly above the charge-neutrality condition or slightly below the charge-neutrality condition (instead of data states 0, 7 and 15), depending on how the above processes need to change the resistance of the NAND string. This configuration can be used with the process described above.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   determining information indicative of a resistance characteristic for a set of non-volatile storage elements, said set of non-volatile storage elements includes data non-volatile storage elements and dummy non-volatile storage elements;
   programming said data non-volatile storage elements; and
   setting one or more dummy non-volatile storage elements based on said determined information indicative of a resistance characteristic, said setting one or more dummy non-volatile storage elements includes setting a first dummy non-volatile storage element and a second dummy non-volatile storage element after completing programming of all data non-volatile storage elements.

2. A method according to claim 1, wherein:
   said information indicative of a resistance characteristic can include information absolute resistance, relative resistance, change in resistance, threshold voltage data that can be used to determine information about resistance, or stored data that can be used to determine information about resistance; and
   said information indicative of a resistance characteristic can pertain to all of said data non-volatile storage elements or a subset of said data non-volatile storage elements.

3. A method according to claim 1, wherein:
   said setting one or more dummy non-volatile storage elements changes said resistance characteristic.

4. A method according to claim 1, wherein:
   said setting one or more dummy non-volatile storage elements changes a group resistance for said set of non-volatile storage elements.

5. A method according to claim 1, wherein:
   said determining information indicative of a resistance characteristic includes determining a deviation of programmed data from a predefined distribution of data.

6. A method according to claim 1, wherein:
   said setting one or more dummy non-volatile storage elements includes adjusting a threshold voltage for the first dummy non-volatile storage element to a threshold voltage range associated with a data state.

7. A method according to claim 1, wherein:
   said setting one or more dummy non-volatile storage elements includes adjusting a threshold voltage for the first dummy non-volatile storage element to an analog value.

8. A method according to claim 1, wherein said determining information indicative of a resistance characteristic comprises:
   determining deviation of change in resistance for at least a subset of said data non-volatile storage elements with respect to a predefined change, for a given data non-volatile storage element said change in resistance is based on pre and post programming of other data non-volatile storage elements;
   identifying a minimum deviation based on said determining deviation;
   identifying a maximum deviation based on said determining deviation; and
   determining a condition for one or more of said dummy non-volatile storage elements that alter said minimum deviation and said maximum deviation in accordance with an error reduction criteria.

9. A method according to claim 8, wherein:
   said setting one or more dummy non-volatile storage elements includes adjusting resistance for said set of non-volatile storage elements by setting said one or more of said dummy non-volatile storage elements to said condition.

10. A method according to claim 8, wherein:
    said predefined change pertains to an even distribution of data.

11. A method according to claim 1, wherein:
    said programming includes verify operations, said verify operations uses a first overdrive voltage for unselected data non-volatile storage elements and a second overdrive voltage for dummy data non-volatile storage elements, said first overdrive voltage is higher than said second overdrive voltage;
    said setting one or more dummy non-volatile storage elements includes adjusting threshold voltages for said setting one or more dummy non-volatile storage elements to be within a range of threshold voltages near charge-neutrality for said dummy non-volatile storage elements; and
    said method includes reading said data non-volatile storage elements, said reading includes using said first overdrive voltage for unselected data non-volatile storage elements and said second overdrive voltage for dummy data non-volatile storage elements.

12. A method according to claim 1, wherein:
    said determining information indicative of a resistance characteristic includes physically measuring resistance information.

13. A method according to claim 1, wherein:
    said data non-volatile storage elements are multi-state flash memory devices.

14. A method according to claim 1, wherein:
    said set of non-volatile storage elements are part of a NAND string; and
    said determining information indicative of resistance includes determining a deviation of programmed data from a predefined set of data.

15. A method for operating non-volatile storage, comprising:
    determining information indicative of a resistance characteristic for a set of non-volatile storage elements, said set of non-volatile storage elements includes data non-volatile storage elements and dummy non-volatile storage elements;
    programming said data non-volatile storage elements; and
    setting one or more dummy non-volatile storage elements based on said determined information indicative of a resistance characteristic, said setting one or more dummy non-volatile storage elements includes setting a first dummy non-volatile storage element after completing programming of a first subset of data non-volatile storage elements and prior to completing programming of all data non-volatile storage elements, said setting one or more dummy non-volatile storage elements further includes setting a second dummy non-volatile storage element after completing programming of all data non-volatile storage elements.

16. A method according to claim 15, wherein:
    said setting one or more dummy non-volatile storage elements includes adjusting a threshold voltage for at least one of said dummy non-volatile storage elements.

17. A method for operating non-volatile storage, comprising:

determining information indicative of a resistance characteristic for a set of non-volatile storage elements, said set of non-volatile storage elements includes data non-volatile storage elements and dummy non-volatile storage elements;

programming said data non-volatile storage elements; and setting one or more dummy non-volatile storage elements based on said determined information indicative of a resistance characteristic, said setting one or more dummy non-volatile storage elements includes setting a first dummy non-volatile storage element after completing programming of a first subset of data non-volatile storage elements and prior to completing programming of all data non-volatile storage elements, said setting one or more dummy non-volatile storage elements further includes setting a second dummy non-volatile storage element after completing programming of a second subset of data non-volatile storage elements and prior to completing programming of all data non-volatile storage elements.

18. A method according to claim 17, wherein:

said determining information indicative of a resistance characteristic includes determining a deviation of programmed data from a predefined distribution of data.

19. A method according to claim 17, wherein:

said setting one or more dummy non-volatile storage elements changes resistance for NAND strings that include said dummy non-volatile storage elements.

20. A method for operating non-volatile storage, comprising:

determining deviation of change in resistance for at least a subset of a set of data non-volatile storage elements with respect to a predefined change, said set of non-volatile storage elements includes data non-volatile storage elements and one or more dummy non-volatile storage elements, for a given data non-volatile storage element said change in resistance is based on pre and post programming of other data non-volatile storage elements;

identifying a minimum deviation based on said determining deviation;

identifying a maximum deviation based on said determining deviation; and determining a condition for one or more of said dummy non-volatile storage elements that alter said minimum deviation and said maximum deviation in accordance with an error reduction criteria; and altering resistance for said set of non-volatile storage elements by setting said one or more of said dummy non-volatile storage elements to said condition.

21. A method according to claim 20, wherein:

said set of non-volatile storage elements are part of a NAND string; and said altering resistance for said set of non-volatile storage elements includes altering resistance for said NAND string by changing threshold voltages for one or more of said dummy non-volatile storage elements.

22. A method for operating non-volatile storage, comprising:

determining information indicative of a resistance characteristic for a set of non-volatile storage elements, said set of non-volatile storage elements includes data non-volatile storage elements and dummy non-volatile storage elements;

programming said data non-volatile storage elements, said programming includes verify operations, said verify operations uses a first overdrive voltage for unselected data non-volatile storage elements and a second overdrive voltage for dummy data non-volatile storage elements, said first overdrive voltage is higher than said second overdrive voltage; and setting one or more dummy non-volatile storage elements to a range of threshold voltages near charge-neutrality for said dummy non-volatile storage elements based on said determined resistance information.

23. A method according to claim 22, wherein said method further comprises:

reading said data non-volatile storage elements, said reading includes using said first overdrive voltage for unselected data non-volatile storage elements and said second overdrive voltage for dummy data non-volatile storage elements.

* * * * *